(12) United States Patent
Lin et al.

(10) Patent No.: US 9,842,030 B2
(45) Date of Patent: *Dec. 12, 2017

(54) DATA STORAGE DEVICE AND FLASH MEMORY CONTROL METHOD

(71) Applicant: Silicon Motion, Inc., Jhubei, Hsinchu County (TW)

(72) Inventors: Chien-Cheng Lin, Yilan (TW);
Chia-Chi Liang, Taichung (TW);
Chang-Chieh Huang, Zhubei (TW);
Jie-Hao Lee, Kaohsiung (TW)

(73) Assignee: SILICON MOTION, INC., Jhubei, Hsinchu County (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/597,742

(22) Filed: May 17, 2017

(65) Prior Publication Data

US 2017/0249219 A1    Aug. 31, 2017

Related U.S. Application Data

(63) Continuation of application No. 14/534,633, filed on Nov. 6, 2014, now Pat. No. 9,684,568.
(Continued)

(51) Int. Cl.
*G06F 11/14* (2006.01)
*G06F 3/06* (2006.01)
(Continued)

(52) U.S. Cl.
CPC ........ *G06F 11/1469* (2013.01); *G06F 3/0604* (2013.01); *G06F 3/0652* (2013.01);
(Continued)

(58) Field of Classification Search
CPC ............. G06F 11/1072; G06F 11/1469; G06F 12/0246; G06F 12/121; G06F 3/0604;
(Continued)

(56) References Cited

U.S. PATENT DOCUMENTS 6,895,490 B1    5/2005    Moore et al.
6,970,890 B1    11/2005    Bruce et al.
(Continued)

FOREIGN PATENT DOCUMENTS

CN    1518000 A    8/2004
CN    101123116 A    2/2008
(Continued)

OTHER PUBLICATIONS

Notice of Allowance dated Mar. 30, 2016, issued in U.S. Appl. No. 15/437,543.
(Continued)

*Primary Examiner* — Rocio Del Mar Perez-Velez
(74) *Attorney, Agent, or Firm* — McClure, Qualey & Rodack, LLP

(57) ABSTRACT

The data storage device included a flash memory, divided into a plurality of blocks with each block comprising a plurality of physical pages, and a control unit, coupling the flash memory to a host and comprising a microcontroller and a random access memory. The microcontroller maintains a plurality of logical-to-physical address mapping tables and a link table on the flash memory to record mapping information between the host and the flash memory and records a link table indicator on the flash memory to indicate a position of the link table. The link table indicates positions of the plurality of logical-to-physical address mapping tables, and each entry in the link table corresponds to one logical-to-physical address mapping table. Further, the microcontroller erases user of logical addresses corresponding to N logical-to-physical address mapping tables.

8 Claims, 5 Drawing Sheets

Related U.S. Application Data

(60) Provisional application No. 61/920,830, filed on Dec. 26, 2013.

(51) Int. Cl.
    *G06F 11/10* (2006.01)
    *G11C 29/52* (2006.01)
    *G06F 12/121* (2016.01)
    *G06F 12/02* (2006.01)
    *G11C 29/04* (2006.01)

(52) U.S. Cl.
    CPC ........ *G06F 3/0679* (2013.01); *G06F 11/1072* (2013.01); *G06F 12/0246* (2013.01); *G06F 12/121* (2013.01); *G11C 29/52* (2013.01); *G06F 2212/1032* (2013.01); *G06F 2212/7201* (2013.01); *G06F 2212/7202* (2013.01); *G06F 2212/7203* (2013.01); *G06F 2212/7209* (2013.01); *G11C 2029/0411* (2013.01); *Y02B 60/1225* (2013.01)

(58) Field of Classification Search
    CPC ................ G06F 3/0652; G06F 3/0679; G06F 2212/1032; G06F 2212/7201; G06F 2212/7202; G06F 2212/7203; G06F 2212/7209; G11C 29/52; G11C 2029/0411; Y02B 60/1225
    See application file for complete search history.

(56) References Cited

U.S. PATENT DOCUMENTS

| | | | |
|---|---|---|---|
| 6,988,175 | B2 | 1/2006 | Lasser |
| 7,603,525 | B2 | 10/2009 | Lasser |
| 7,886,108 | B2 | 2/2011 | Lee et al. |
| 7,904,635 | B2 | 3/2011 | Deng et al. |
| 8,078,794 | B2 | 12/2011 | Lee et al. |
| 8,352,706 | B2 | 1/2013 | Yano et al. |
| 8,688,894 | B2 | 4/2014 | Kuehne |
| 9,311,006 | B2 | 4/2016 | Moshayedi |
| 9,355,028 | B2 | 5/2016 | Cheng |
| 2003/0163630 | A1 | 8/2003 | Aasheim et al. |
| 2004/0268063 | A1 | 12/2004 | Lasser |
| 2006/0282644 | A1 | 12/2006 | Wong |
| 2007/0021963 | A1 | 1/2007 | Deng et al. |
| 2007/0156998 | A1 | 7/2007 | Gorobets |
| 2007/0300037 | A1 | 12/2007 | Rogers et al. |
| 2008/0104309 | A1 | 5/2008 | Cheon et al. |
| 2008/0126680 | A1 | 5/2008 | Lee et al. |
| 2008/0215800 | A1 | 9/2008 | Lee et al. |
| 2008/0256287 | A1 | 10/2008 | Lee et al. |
| 2009/0144501 | A2 | 6/2009 | Yim et al. |
| 2009/0172262 | A1 | 7/2009 | Olbrich et al. |
| 2009/0240871 | A1 | 9/2009 | Yano et al. |
| 2009/0240873 | A1 | 9/2009 | Yu et al. |
| 2009/0300082 | A1 | 12/2009 | Chen et al. |
| 2009/0327589 | A1 | 12/2009 | Moshayedi |
| 2009/0327591 | A1 | 12/2009 | Moshayedi |
| 2009/0327840 | A1 | 12/2009 | Moshayedi |
| 2010/0030999 | A1 | 2/2010 | Hinz |
| 2010/0082883 | A1 | 4/2010 | Chen et al. |
| 2010/0169551 | A1 | 7/2010 | Yano et al. |
| 2010/0174851 | A1 | 7/2010 | Leibowitz et al. |
| 2010/0299494 | A1 | 11/2010 | Van Acht et al. |
| 2010/0306451 | A1 | 12/2010 | Johnson |
| 2011/0055458 | A1 | 3/2011 | Kuehne |
| 2011/0087829 | A1 | 4/2011 | Lin |
| 2011/0289255 | A1 | 11/2011 | Wang et al. |
| 2012/0005415 | A1 | 1/2012 | Jung et al. |
| 2012/0239862 | A1 | 9/2012 | Seo et al. |
| 2012/0297121 | A1 | 11/2012 | Gorobets et al. |
| 2012/0311245 | A1 | 12/2012 | Yano et al. |
| 2013/0024642 | A1 | 1/2013 | Flynn et al. |
| 2013/0304975 | A1 | 11/2013 | Wang et al. |
| 2013/0326120 | A1 | 12/2013 | Cheng |
| 2013/0326169 | A1 | 12/2013 | Shaharabany et al. |
| 2014/0006898 | A1 | 1/2014 | Sharon et al. |
| 2014/0101369 | A1 | 4/2014 | Tomlin et al. |
| 2014/0122776 | A1 | 5/2014 | El Maghraoui et al. |
| 2014/0136753 | A1 | 5/2014 | Tomlin et al. |
| 2014/0244903 | A1 | 8/2014 | Yano et al. |
| 2015/0127687 | A1 | 5/2015 | Graves |
| 2015/0261444 | A1 | 9/2015 | Yoshii et al. |

FOREIGN PATENT DOCUMENTS

| | | |
|---|---|---|
| CN | 101346704 A | 1/2009 |
| CN | 101667157 A | 3/2010 |
| CN | 102332290 A | 1/2012 |
| CN | 102591748 A | 7/2012 |
| CN | 102682848 A | 9/2012 |
| CN | 103150125 A | 6/2013 |
| CN | 102063377 B | 9/2013 |
| CN | 103455428 A | 12/2013 |
| CN | 103455437 A | 12/2013 |
| TW | 201142589 A | 12/2011 |
| TW | 201305817 A | 2/2013 |
| TW | 201348958 A | 12/2013 |
| TW | 201348959 A | 12/2013 |

OTHER PUBLICATIONS

Office Action dated May 26, 2016, issued in U.S. Appl. No. 14/534,686.
Office Action dated Jun. 21, 2016, issued in U.S. Appl. No. 14/534,535.
Office Action dated Jul. 1, 2016, issued in U.S. Appl. No. 14/534,603.

DATA STORAGE DEVICE AND FLASH MEMORY CONTROL METHOD

CROSS REFERENCE TO RELATED APPLICATIONS

This application is a Continuation of pending U.S. application Ser. No. 14/534,633, filed Nov. 6, 2014, which claims the benefit of U.S. Provisional Application No. 61/920,830, filed Dec. 26, 2013, the entirety of which is incorporated by reference herein.

BACKGROUND OF THE INVENTION

Field of the Invention

The present invention relates to data storage devices with flash memory and flash memory control methods.

Description of the Related Art

Flash memory, a data storage medium, is common in today's data storage devices. For example, flash memory is typically used in memory cards, USB flash devices, solid-state drives, and so on. In another application with multi-chip package technology, a NAND flash chip and a controller chip are combined in one package as an embedded multi-media card (e.g. eMMC).

A flash memory device provides storage space which is divided into blocks, and each block includes a plurality of pages. An erase operation designed for flash memory is performed on a block-by-block basis, to release space one block at a time. When updating data, the new data is written into a spare space rather than being overwritten on old data. To manage the flash memory, the physical-to-logical address mapping information has to be recorded in the flash memory. It is more complex to manage a flash memory rather than other conventional storage mediums, especially for a large-sized flash memory. It can be very tricky to manage the mapping information of a large-sized flash memory.

BRIEF SUMMARY OF THE INVENTION

Data storage device with flash memory and flash memory control method with high erasing efficiency are disclosed.

In one embodiment, a data storage device, comprises: a flash memory, divided into a plurality of blocks with each block comprising a plurality of physical pages; and a control unit, coupling the flash memory to a host and comprising a microcontroller and a random access memory. The microcontroller maintains a plurality of logical-to-physical address mapping tables and a link table on the flash memory to record mapping information between the host and the flash memory and records a link table indicator on the flash memory to indicate a position of the link table. The link table indicates positions of the plurality of logical-to-physical address mapping tables, and each entry in the link table corresponds to one logical-to-physical address mapping table. In addition, the microcontroller erases user of logical addresses corresponding to N logical-to-physical address mapping tables by downloading the link table from the flash memory to the random access memory, invalidating N entries corresponding to the N logical-to-physical address mapping tables in the link table on the random access memory, uploading the link table with the N entries of invalid data back to the flash memory, and records an updated link table indicator on the flash memory to indicate a position of the uploaded link table on the flash memory, where N is an integer.

In an embodiment, a flash memory control method, comprises: maintaining a plurality of logical-to-physical address mapping tables and a link table on a flash memory to record mapping information between a host and the flash memory, wherein the flash memory provides a storage space divided into a plurality of blocks with each block comprising a plurality of pages, and the link table indicates positions of the plurality of logical-to-physical address mapping tables, and each entry in the link table corresponds to one logical-to-physical address mapping table; recording a link table indicator on the flash memory to indicate a position of the link table; erasing user of logical addresses corresponding to N logical-to-physical address mapping tables by downloading the link table from the flash memory to a random access memory, invalidating N entries corresponding to N logical-to-physical address mapping tables in the link table on the random access memory, uploading the link table with the N entries of invalid data back to the flash memory, and recording an updated link table indicator on the flash memory to indicate a position of the uploaded link table on the flash memory, where N is an integer.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
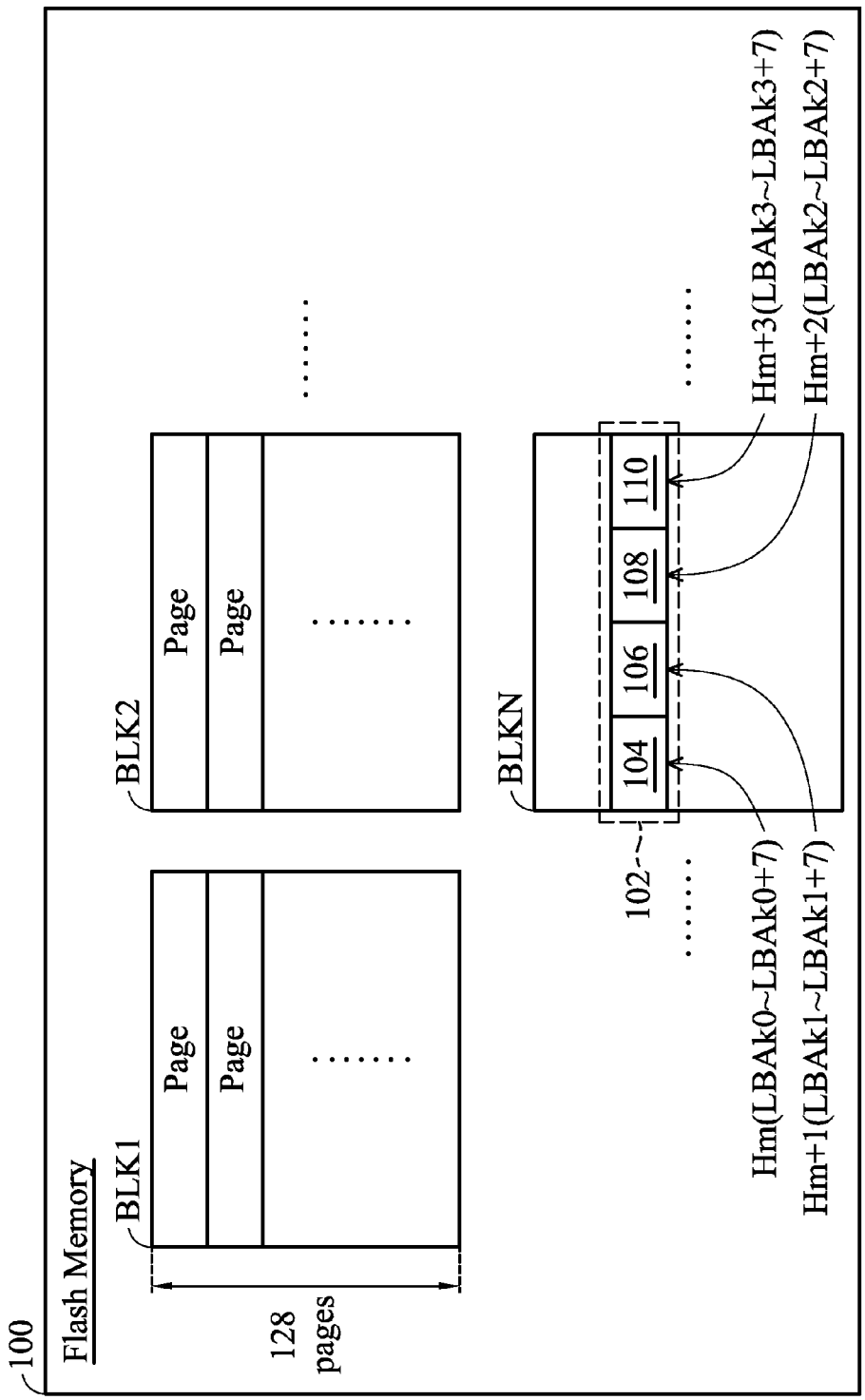
FIG. 1 depicts a storage space provided by a flash memory 100.

FIG. 1 depicts a storage space provided by a flash memory 100. The storage space provided by the flash memory 100 is divided into blocks (e.g., BLK1, BLK2 . . . BLKN . . . ). Each block includes a plurality of physical pages. Each physical page includes a plurality of sectors. For example, physical page 102 provided within block BLKN includes four sectors 104, 106, 108 and 110.

When each sector is allocated for the storage of the user data of one host page (corresponding to a series of logical addresses, e.g. LBAk to LBAk+7), each physical page stores four host pages. For example, the four sectors 104, 106, 108 and 110 correspond to four host pages Hm (i.e. from LBAk0 to LBAk0+7), Hm+1 (i.e. from LBAk1 to LBAk1+7), Hm+2 (i.e. from LBAk2 to LBAk2+7) and Hm+3 (i.e. from LBAk3 to LBAk3+7), respectively. When one block contains 128 physical pages, there are 128×4 host pages corresponding to the 128×4 sectors of the block. For each block, the mapping information between the 128×4 sectors and the 128×4 host pages has to be recorded for storage space management. For a large-sized flash memory, large amounts of mapping information have to be managed.

In an exemplary embodiment, the considerable quantity of mapping information is recorded in the flash memory 100 for non-volatile storage. The mapping information is presented in a multi-level architecture. A plurality of logical-to-physical address mapping tables (abbreviated to H2Fs) and a link table indicating the positions of the plurality of logical-to-physical address mapping tables H2Fs are provided within a flash memory to show the mapping information.

Figure 2:
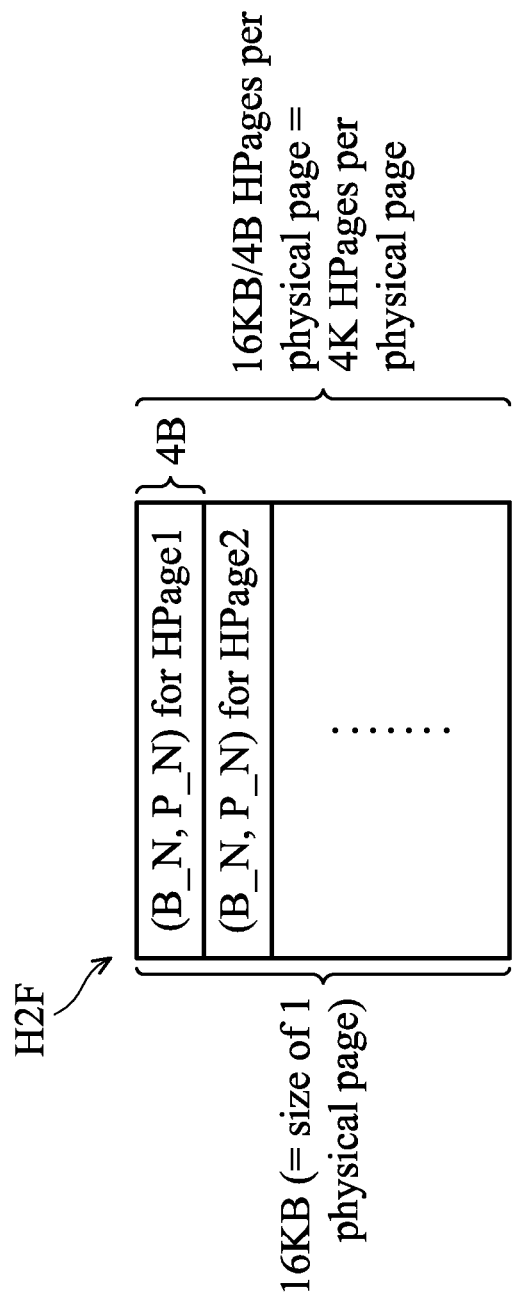
FIG. 2 depicts a logical-to-physical address mapping table in accordance with an exemplary embodiment of the disclosure.

FIG. 2 depicts a logical-to-physical address mapping table H2F in accordance with an exemplary embodiment of the disclosure. The logical-to-physical address mapping table H2F is 16 KB, equal to 1 physical page. Each entry in the logical-to-physical address mapping table H2F is 4B. Thus, there is mapping information about 4K (=16 KB/4B) host pages per logical-to-physical address mapping table. Each entry corresponds to one host page and is recorded with a block number B_N and a page number P_N showing where the host page is stored in the flash memory. It is not intended to limit the table size to 16 KB, and it is not intended to limit the mapping information about each host page to 4B.

Figure 3:
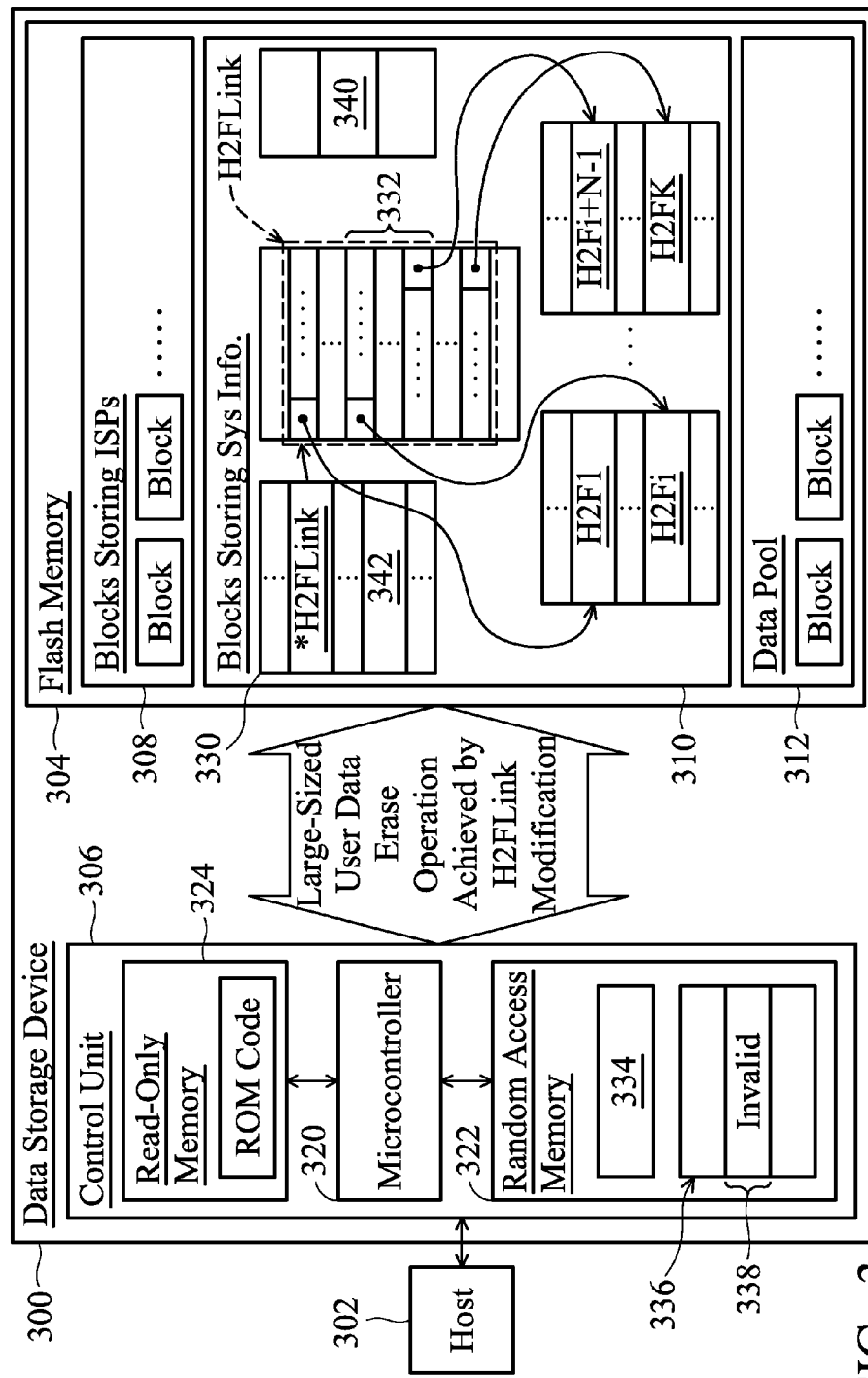
FIG. 3 is a block diagram depicting a data storage device 300 in accordance with an exemplary embodiment of the disclosure.

FIG. 3 is a block diagram depicting a data storage device 300 in accordance with an exemplary embodiment of the disclosure. The data storage device 300, operating in accord with commands from the host 302, includes a flash memory 304 and a control unit 306. In the flash memory 304, the blocks are allocated for several purposes. Blocks 308 are stored with in-system programs (ISPs). Blocks 310 store system information. User data are stored in the data pool 312. The flash memory 304 may further contain free blocks, spare blocks and run-time write blocks not shown in the figure.

The control unit 306 couples the flash memory 304 to the host 302 and comprises a microcontroller 320, a random access memory 322 and a read-only memory 324. A ROM code is stored in the read-only memory 324. The microcontroller 320 operates the flash memory 304 by executing the ROM code stored in the read-only memory 324 or/and by executing the ISPs stored in the blocks 308 of the flash memory 304. The microcontroller 320 is configured to perform the block allocation of the flash memory 304 (as shown in FIG. 3).

The microcontroller 320 is further configured to provide a link table indicator *H2FLink, logical-to-physical address mapping tables H2F1 . . . H2Fi . . . H2Fi+N−1 . . . H2FK and a link table H2FLink on the flash memory 304 to record logical-to-physical address mapping information between the host 302 and the flash memory 304. The link table indicator *H2FLink in a system block 330 indicates the position of the link table H2FLink. The link table indicator *H2FLink may indicate the position of the link table H2FLink by a block number and a page number. The link table H2FLink indicates the positions of the plurality of logical-to-physical address mapping tables H2F1 . . . H2FK. The different entries in the link table H2FLink correspond to the different logical-to-physical address mapping tables H2F1 . . . H2FK. In an exemplary embodiment, each entry in the link table H2FLink may be stored with a block number and a page number that indicate the position of the logical-to-physical address mapping table corresponding thereto. In the following discussion, a request to erase user data of logical addresses corresponding to N logical-to-physical address mapping tables H2Fi . . . H2Fi+N−1 is requested. As shown, N entries 332 in the link table H2FLink correspond to the N logical-to-physical address mapping tables H2Fi . . . H2Fi+N−1. The microcontroller 320 is configured to read the system block 330 to download the link table indicator *H2FLink from the flash memory 304 to a space 334 of the random access memory 322. Furthermore, based on the link table indicator *H2FLink, the microcontroller 320 downloads the link table H2FLink from the flash memory 304 to a space 336 of the random access memory 322 and invalidates the N entries 338 of the link table on the random access memory 322. The microcontroller 320 uploads the link table with the N entries 338 of invalid data back to the flash memory 304 (e.g. into a spare area 340 of the flash memory 304). When uploading the link table with the N entries 338 of invalid data back to the flash memory 304 (into the spare area 340), the microcontroller 320 further updates the system block 330 with an updated link table indicator 342 to indicate the new position 340 of the updated link table. In this manner, even though a large-sized erase operation for the logical addresses relating to the N logical-to-physical address mapping tables H2Fi . . . H2Fi+N−1 is requested (e.g. a request to erase sequential data along the logical address covered by the N logical-to-physical address mapping tables H2Fi . . . H2Fi+N−1), just a few system resources are required. Instead of downloading all of the N logical-to-physical address mapping tables H2Fi . . . H2Fi+N−1 from the flash memory 304 to the random access memory 322 for mapping information modification, the large-sized erase operation is achieved by easily modifying the link table indicator *H2FLink and the link table H2FLink. The system efficiency of the data storage device 300 is considerably improved.

Figure 4:
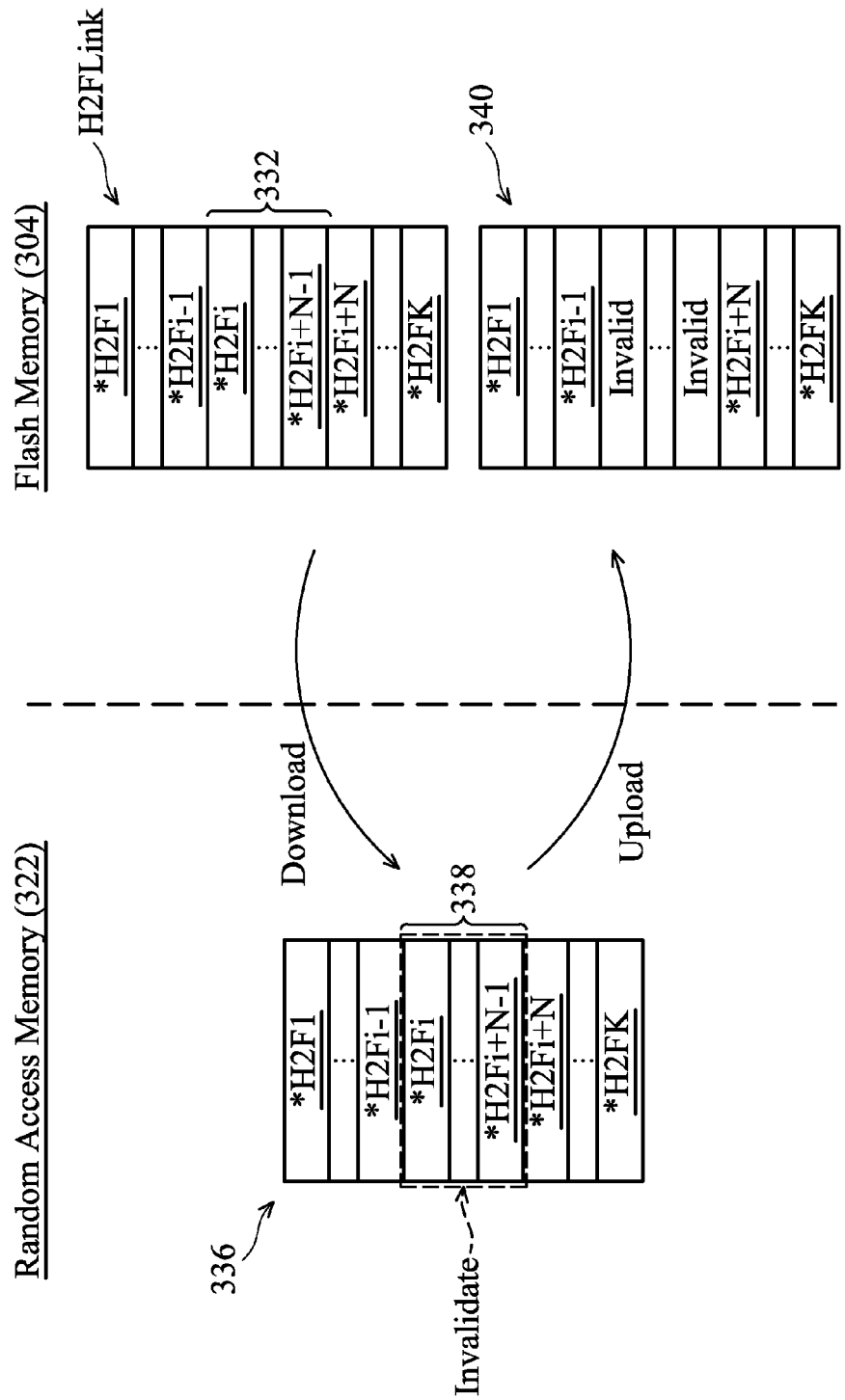
FIG. 4 depicts the link table H2FLink modification with respect to the architecture of FIG. 3.

FIG. 4 depicts the link table H2FLink modification with respect to the architecture of FIG. 3. As shown, the link table H2FLink is stored with pointers *H2F1 . . . *H2FK linked to the logical-to-physical address mapping tables H2F1 . . . H2FK, respectively. To erase user data of logical addresses corresponding to the N logical-to-physical address mapping tables H2Fi . . . H2Fi+N−1, the link table H2FLink is downloaded to space 336 of the random access memory 322 and the N entries 338 of the link table are invalidated on the random access memory 322. Then the link table with the N entries 338 of invalid data is uploaded back to the flash memory 304 into space 340. The former link table H2FLink is invalidated.

Figure 5:
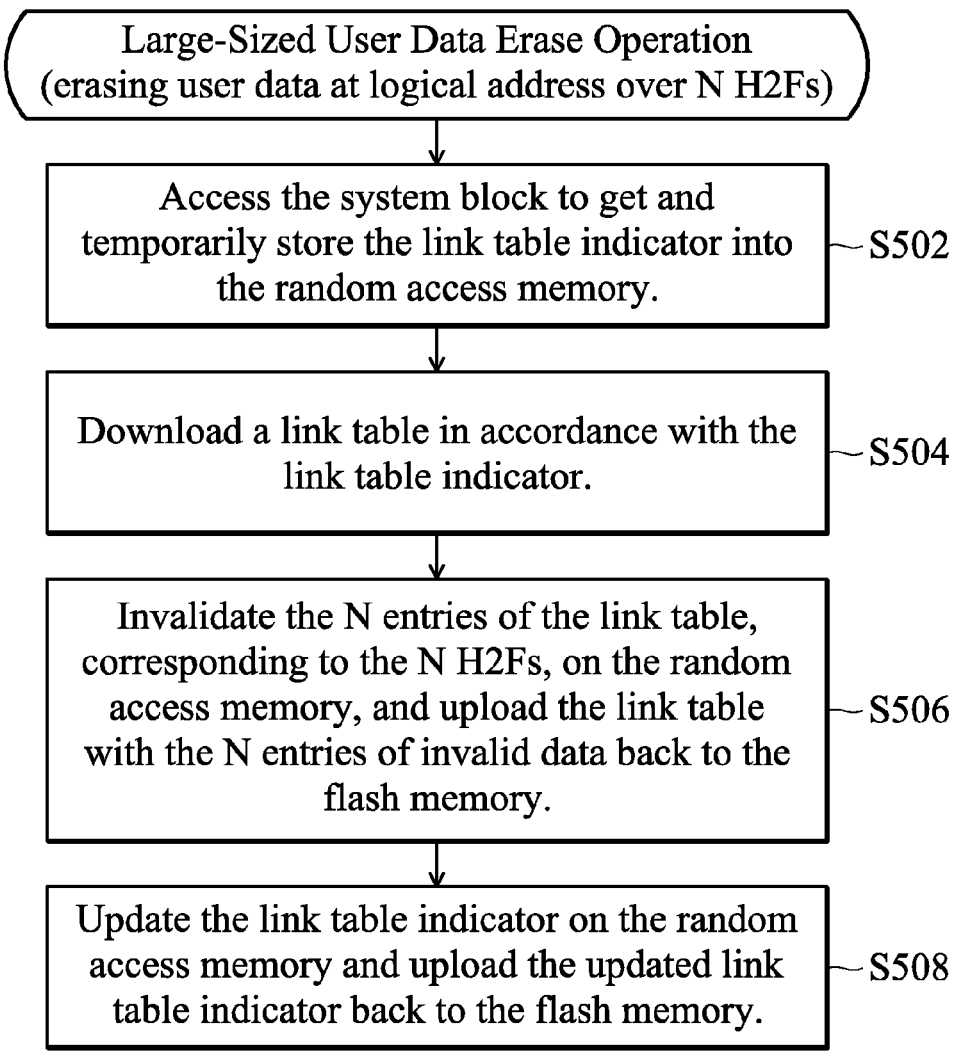
FIG. 5 is a flowchart depicting how to erase the large-sized user data (with logical addresses corresponding to the N entries 332 of the link table H2FLink, with logical-to-physical address mapping information stored in the N logical-to-physical address mapping tables H2Fi . . . H2Fi+N−1) in accordance with an exemplary embodiment of the disclosure.

FIG. 5 is a flowchart depicting how to erase the large-sized user data (with logical addresses corresponding to the N entries 332 of the link table H2FLink, with logical-to-physical address mapping information stored in the N logical-to-physical address mapping tables H2Fi . . . H2Fi+N−1) in accordance with an exemplary embodiment of the disclosure. The flowchart of FIG. 5 is discussed with respect to the architecture of FIG. 3.

In step S502, the system block 330 is accessed and thereby the link table indicator *H2FLink is retrieved therefrom and temporarily stored into space 334 of the random access memory 322. In step S504, the link table H2FLink is downloaded from the flash memory 304 and temporarily stored into the random access memory 322 in space 336. In step S506, the N entries 338 of the link table stored in the random access memory 322 is invalidated and the link table with the N entries of invalid data is uploaded back to the flash memory 304 into space 340. In step S508, the link table indicator in space 334 is updated to indicate the position of the space 340 and the updated link table indicator is uploaded back to the flash memory 304 into space 342.

Any technique using the aforementioned concept to control a flash memory is within the scope of the invention. The invention further involves flash memory control methods, which are not limited to any specific controller architecture.

While the invention has been described by way of example and in terms of the embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A data storage device, comprising:
a flash memory, divided into a plurality of blocks with each block comprising a plurality of physical pages; and
a control unit, coupling the flash memory to a host and comprising a microcontroller and a random access memory,
wherein:
the microcontroller maintains a plurality of logical-to-physical address mapping tables and a link table on the flash memory to record mapping information between the host and the flash memory and records a link table indicator on the flash memory to indicate a position of the link table;
the link table indicates positions of the plurality of logical-to-physical address mapping tables, and each entry in the link table corresponds to one logical-to-physical address mapping table; and
the microcontroller erases user data of logical addresses corresponding to N logical-to-physical address mapping tables by downloading the link table from the flash memory to the random access memory, invalidating N entries corresponding to the N logical-to-physical address mapping tables in the link table on the random access memory, uploading the link table with the N entries of invalid data back to the flash memory, and records an updated link table indicator on the flash memory to indicate a position of the uploaded link table on the flash memory, where N is an integer.

2. The data storage device as claimed in claim 1, wherein:
the microcontroller downloads the link table indicator from a system block of the flash memory to a space of the random access memory and downloads the link table from the flash memory to the random access memory in accordance with the link table indicator; and
the microcontroller further updates the link table indicator in the space of the random access memory and uploads the updated link table indicator back to the system block of the flash memory.

3. The data storage device as claimed in claim 1, wherein:
the link table indicator indicates the position of the link table by a block number and a page number.

4. The data storage device as claimed in claim 1, wherein:
each entry in the link table stores a block number and a page number that indicate the position of the logical-to-physical address mapping table corresponding thereto.

5. A flash memory control method, comprising:
maintaining a plurality of logical-to-physical address mapping tables and a link table on a flash memory to record mapping information between a host and the flash memory, wherein the flash memory provides a storage space divided into a plurality of blocks with each block comprising a plurality of pages, and the link table indicates positions of the plurality of logical-to-physical address mapping tables, and each entry in the link table corresponds to one logical-to-physical address mapping table;
recording a link table indicator on the flash memory to indicate a position of the link table;
erasing user data of logical addresses corresponding to N logical-to-physical address mapping tables by downloading the link table from the flash memory to a random access memory, invalidating N entries corresponding to N logical-to-physical address mapping tables in the link table on the random access memory, uploading the link table with the N entries of invalid data back to the flash memory, and recording an updated link table indicator on the flash memory to indicate a position of the uploaded link table on the flash memory, where N is an integer.

6. The flash memory control method as claimed in claim 5, further comprising:
downloading the link table indicator from a system block of the flash memory to a space of the random access memory, wherein the link table is downloaded from the flash memory to the random access memory in accordance with the link table indicator;
updating the link table indicator in the space of the random access memory; and
uploading the updated link table indicator back to the system block of the flash memory.

7. The flash memory control method as claimed in claim 5, wherein:
the link table indicator indicates the position of the link table by a block number and a page number.

8. The flash memory control method as claimed in claim 5, wherein:
each entry in the link table stores a block number and a page number that indicate the position of the logical-to-physical address mapping table corresponding thereto.

* * * * *